(12) United States Patent
Iguchi

(10) Patent No.: US 11,605,613 B2
(45) Date of Patent: Mar. 14, 2023

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Tomohiro Iguchi, Himeji Hyogo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/198,309

(22) Filed: Mar. 11, 2021

(65) Prior Publication Data

US 2021/0351161 A1    Nov. 11, 2021

(30) Foreign Application Priority Data

May 8, 2020    (JP) .............................. JP2020-082417

(51) Int. Cl.
*H01L 25/065* (2006.01)
*H01L 23/00* (2006.01)
*H01L 23/498* (2006.01)
*H01L 23/538* (2006.01)
*H01L 27/07* (2006.01)

(52) U.S. Cl.
CPC .... *H01L 25/0655* (2013.01); *H01L 23/49811* (2013.01); *H01L 23/538* (2013.01); *H01L 24/48* (2013.01); *H01L 27/0727* (2013.01); *H01L 2224/48175* (2013.01); *H01L 2924/1207* (2013.01); *H01L 2924/12032* (2013.01); *H01L 2924/13091* (2013.01); *H01L 2924/182* (2013.01); *H01L 2924/186* (2013.01)

(58) Field of Classification Search
CPC ........... H01L 25/0655; H01L 23/49811; H01L 23/538; H01L 24/48; H01L 27/0727
See application file for complete search history.

(56) References Cited

U.S. PATENT DOCUMENTS 9,966,344 B2 * 5/2018 Soyano ................... H01L 23/48
2002/0024134 A1 2/2002 Arai et al.
(Continued)

FOREIGN PATENT DOCUMENTS

CN    208637413 U  *  3/2019   ... H01L 2224/49175
JP    2010087400 A      4/2010
(Continued)

*Primary Examiner* — Jasmine J Clark
(74) *Attorney, Agent, or Firm* — Allen & Overy LLP

(57) ABSTRACT

According to an embodiment, provided is a semiconductor device includes an insulating substrate; a first main terminal; a second main terminal; an output terminal; a first metal layer connected to the first main terminal; a second metal layer connected to the second main terminal; a third metal layer disposed between the first metal layer and the second metal layer and connected to the output terminal; a first semiconductor chip and a second semiconductor chip provided on the first metal layer; and a third semiconductor chip and a fourth semiconductor chip provided on the third metal layer. The second metal layer includes a first slit. Alternatively, the third metal layer includes a second slit.

16 Claims, 11 Drawing Sheets

(56) References Cited

U.S. PATENT DOCUMENTS

2015/0287665 A1* 10/2015 Hanada ................ H01L 21/565
                                                        257/691
2017/0170157 A1    6/2017 Masuda et al.
2019/0035770 A1*  1/2019 Iguchi .................... H01L 23/24

FOREIGN PATENT DOCUMENTS

| JP | 4484400 B2 | 6/2010 |
| JP | 4955077 B2 | 6/2012 |
| JP | 4955078 B2 | 6/2012 |
| JP | 2018-207044 A | 12/2018 |
| JP | 2019-220563 A | 12/2019 |
| WO | 2016009496 A1 | 1/2016 |
| WO | 2018043535 A1 | 8/2018 |

* cited by examiner

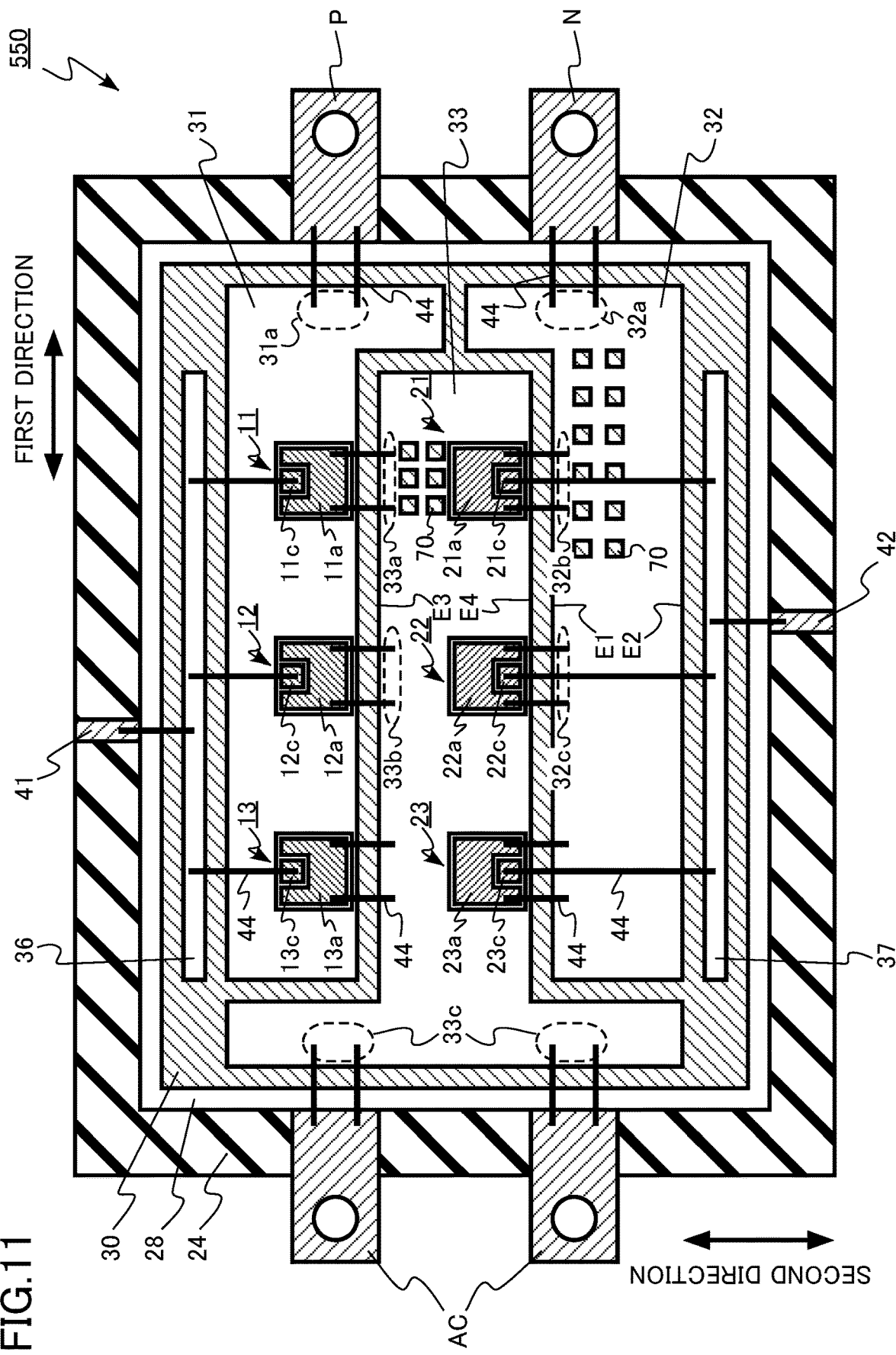

SEMICONDUCTOR DEVICE

CROSS-REFERENCE TO RELATED APPLICATION

This application is based upon and claims the benefit of priority from Japanese Patent Application No. 2020-082417, filed on May 8, 2020, the entire contents of which are incorporated herein by reference.

FIELD

Embodiments described herein relate generally to semiconductor devices.

BACKGROUND

In a power semiconductor module, for example, a power semiconductor chip is mounted on a metal base with an insulating substrate interposed therebetween. The power semiconductor chip is, for example, a metal oxide field effect transistor (MOSFET). In the power semiconductor module, in order to reduce power consumption, it is desired to reduce a switching time and, thus, to reduce a switching loss.

BRIEF DESCRIPTION OF THE DRAWINGS

FIG. 11 is a schematic top view of a semiconductor device according to Modified Example of the fifth embodiment.

DETAILED DESCRIPTION

Figure 1:
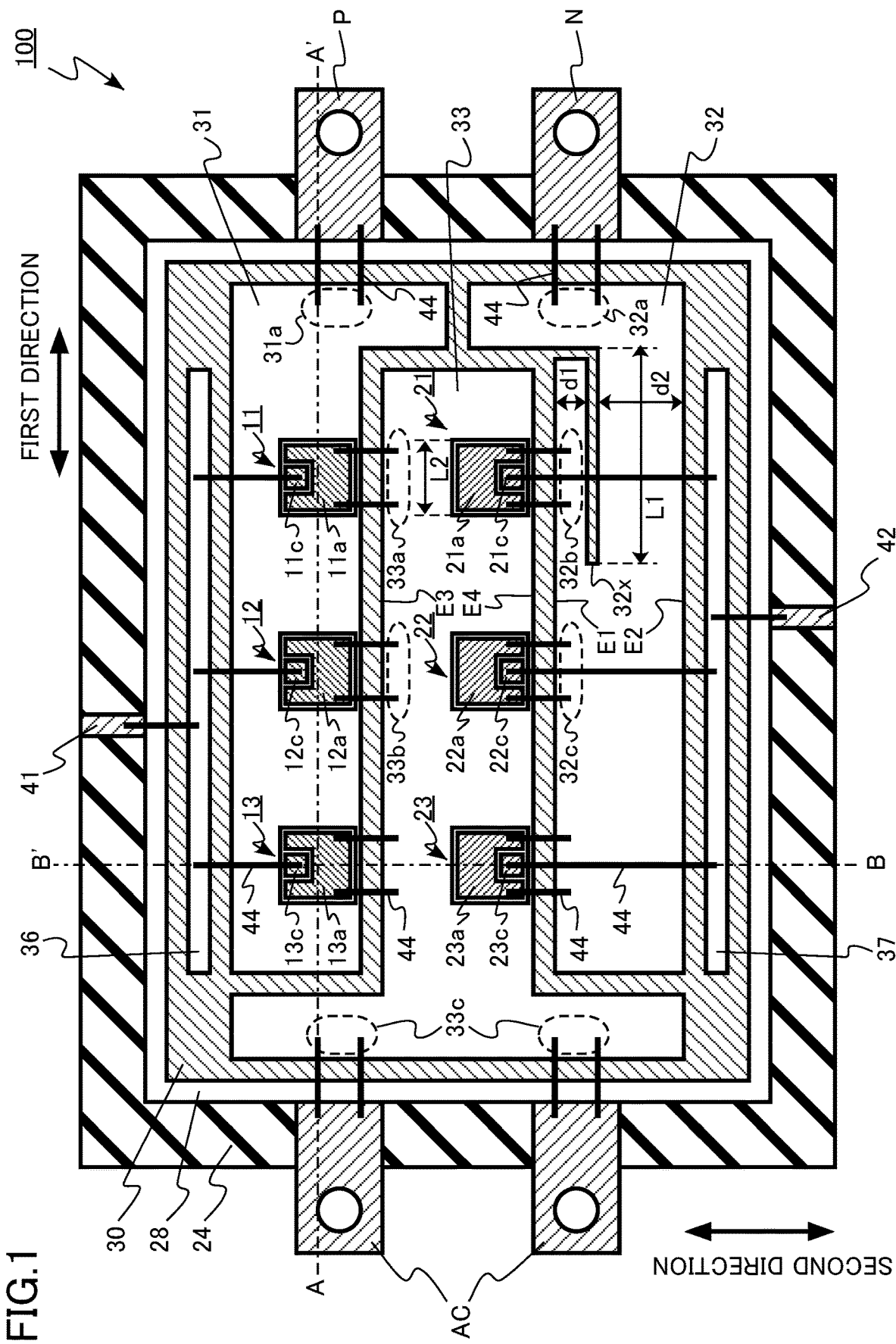
FIG. 1 is a schematic top view of a semiconductor device according to a first embodiment.

According to an embodiment, there is provided a semiconductor device including: an insulating substrate having one end and the other end opposite to the one end; a first main terminal provided on a side of the one end; a second main terminal provided on the side of the one end; an output terminal provided on a side of the other end; a first metal layer provided on the insulating substrate, the first metal layer having a first region, and the first metal layer electrically connected to the first main terminal in the first region; a second metal layer provided on the insulating substrate, the second metal layer having a second region, a third region, and a fourth region, and the second metal layer electrically connected to the second main terminal in the second region; a third metal layer provided on the insulating substrate, the third metal layer disposed between the first metal layer and the second metal layer, the third metal layer having a fifth region, a sixth region, and a seventh region, and the third metal layer electrically connected to the output terminal in the seventh region; a first semiconductor chip including a first upper electrode, a first lower electrode, and a first gate electrode, and the first semiconductor chip provided on the first metal layer, the first upper electrode electrically connected to the fifth region, and the first lower electrode electrically connected to the first metal layer; a second semiconductor chip including a second upper electrode, a second lower electrode, and a second gate electrode, and the second semiconductor chip provided on the first metal layer, the second upper electrode electrically connected to the sixth region, the second lower electrode electrically connected to the first metal layer, and a distance between the first region and the second semiconductor chip being larger than a distance between the first region and the first semiconductor chip; a third semiconductor chip including a third upper electrode, a third lower electrode, and a third gate electrode, and the third semiconductor chip provided on the third metal layer, the third upper electrode electrically connected to the third region, and the third lower electrode electrically connected to the third metal layer; and a fourth semiconductor chip including a fourth upper electrode, a fourth lower electrode, and a fourth gate electrode, and the fourth semiconductor chip provided on the third metal layer, the fourth upper electrode electrically connected to the fourth region, the fourth lower electrode electrically connected to the third metal layer, and a distance between the fifth region and the fourth semiconductor chip is larger than a distance between the fifth region and the third semiconductor chip, wherein the second metal layer has a first end on a side facing the third metal layer and a second end on a side opposite to the first end and the second metal layer includes a first slit disposed between the third region and the second end, or wherein the third metal layer has a third end on a side facing the first metal layer and a fourth end on a side opposite to the third end and the third metal layer includes a second slit disposed between the fifth region and the fourth end.

In this specification, in some cases, the same or similar members may be denoted by the same reference numerals, and duplicate description may be omitted.

In this specification, in order to indicate a positional relationship of components and the like, the upward direction of the drawing may be described as "upper" and the downward direction of the drawing may be described as "lower". In this specification, the concepts of "upper" and "lower" do not necessarily indicate a relationship with the direction of gravity.

First Embodiment

A semiconductor device according to a first embodiment includes: an insulating substrate having one end and the other end opposite to the one end; a first main terminal provided on a side of the one end; a second main terminal provided on the side of the one end; an output terminal provided on a side of the other end; a first metal layer provided on the insulating substrate, the first metal layer having a first region, and the first metal layer electrically connected to the first main terminal in the first region; a second metal layer provided on the insulating substrate, the second metal layer having a second region, a third region, and a fourth region, and the second metal layer electrically connected to the second main terminal in the second region; a third metal layer provided on the insulating substrate, the third metal layer disposed between the first metal layer and the second metal layer, the third metal layer having a fifth region, a sixth region, and a seventh region, and the third metal layer electrically connected to the output terminal in the seventh region; a first semiconductor chip including a first upper electrode, a first lower electrode, and a first gate electrode, and the first semiconductor chip provided on the first metal layer, the first upper electrode electrically connected to the fifth region, and the first lower electrode electrically connected to the first metal layer; a second semiconductor chip including a second upper electrode, a second lower electrode, and a second gate electrode, and the second semiconductor chip provided on the first metal layer, the second upper electrode electrically connected to the sixth region, the second lower electrode electrically connected to the first metal layer, and a distance between the first region and the second semiconductor chip being larger than a distance between the first region and the first semiconductor chip; a third semiconductor chip including a third upper electrode, a third lower electrode, and a third gate electrode, and the third semiconductor chip provided on the third metal layer, the third upper electrode electrically connected to the third region, and the third lower electrode electrically connected to the third metal layer; and a fourth semiconductor chip including a fourth upper electrode, a fourth lower electrode, and a fourth gate electrode, and the fourth semiconductor chip provided on the third metal layer, the fourth upper electrode electrically connected to the fourth region, the fourth lower electrode electrically connected to the third metal layer, and a distance between the fifth region and the fourth semiconductor chip is larger than a distance between the fifth region and the third semiconductor chip. The second metal layer has a first end on a side facing the third metal layer and a second end on a side opposite to the first end and the second metal layer includes a first slit disposed between the third region and the second end.

Figure 2:
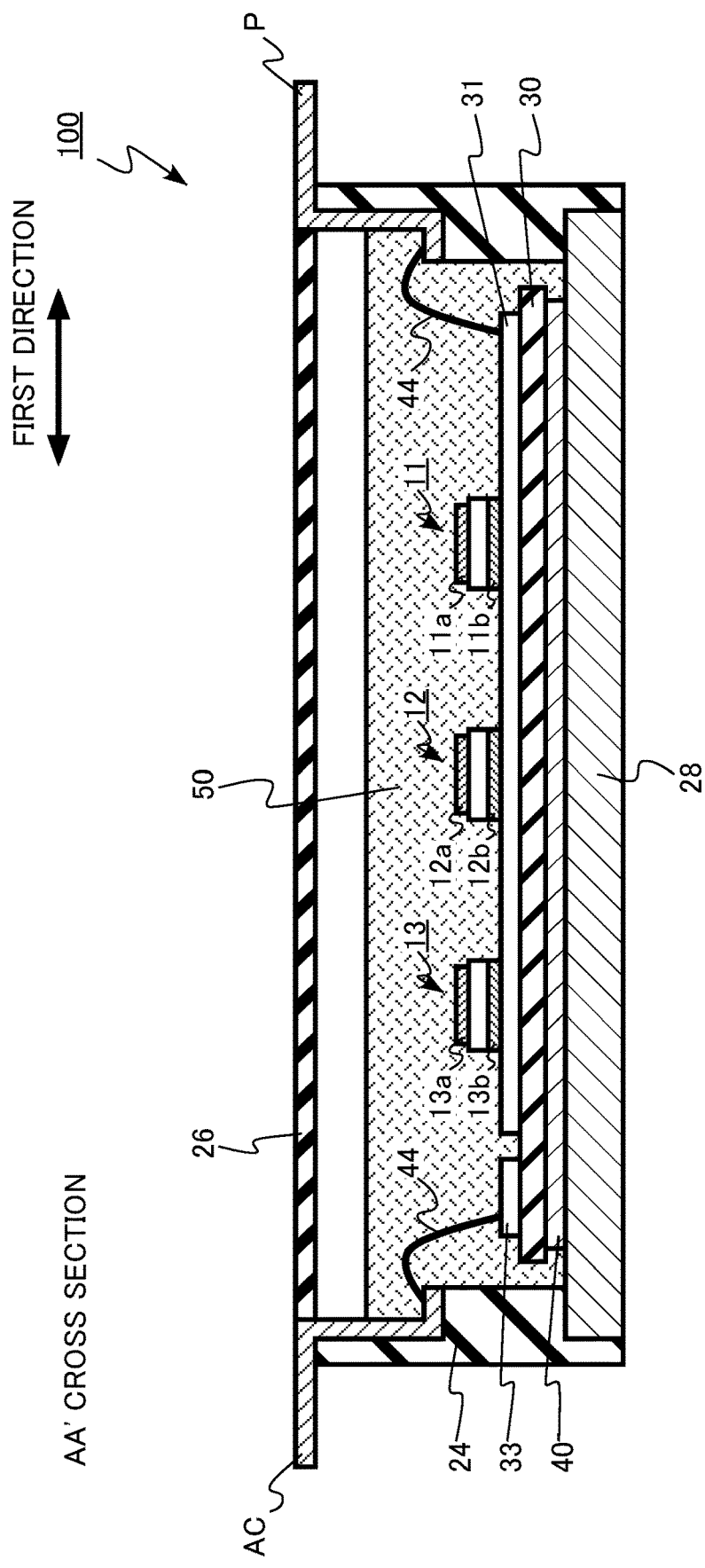
FIG. 2 is a schematic cross-sectional view of the semiconductor device according to the first embodiment.
Figure 3:
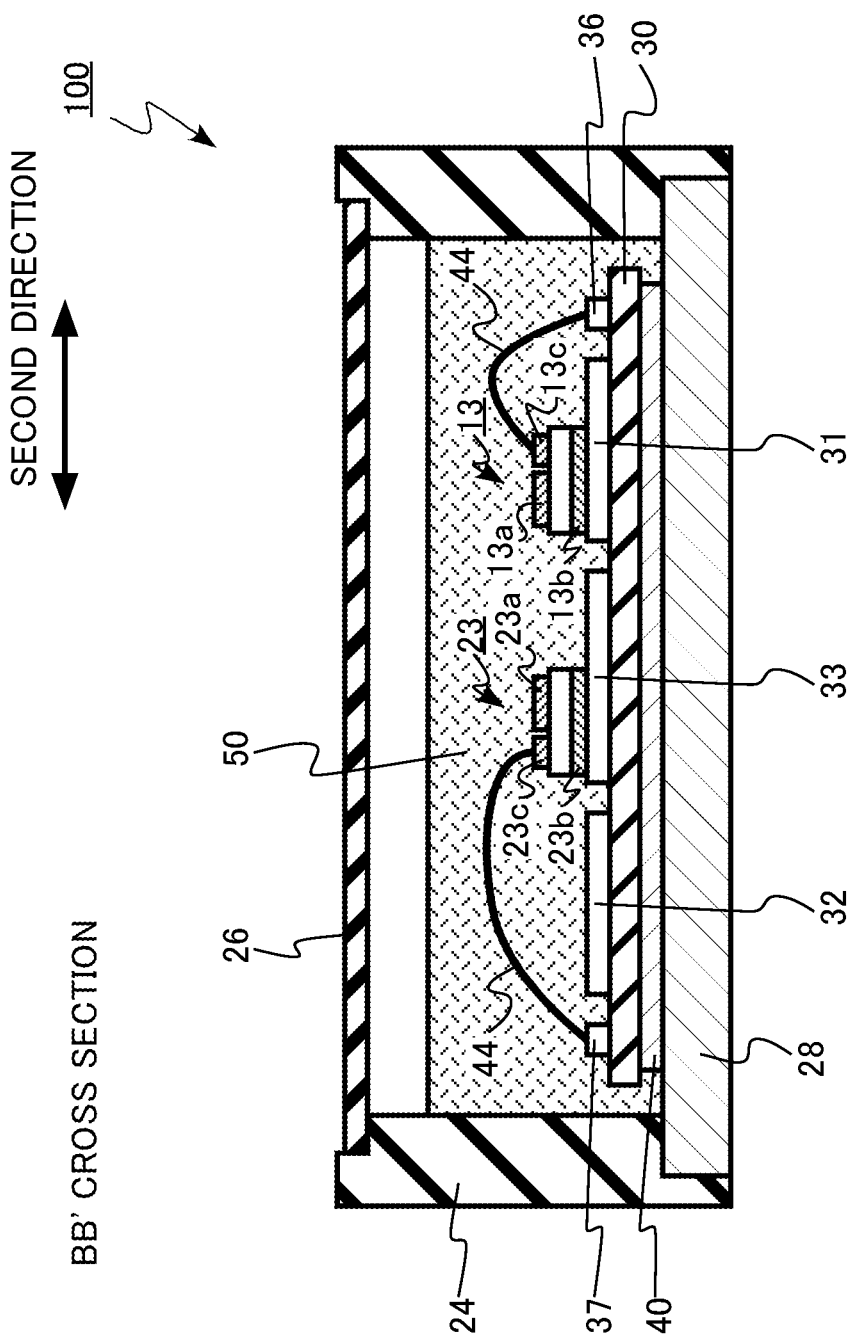
FIG. 3 is a schematic cross-sectional view of the semiconductor device according to the first embodiment.
Figure 4:
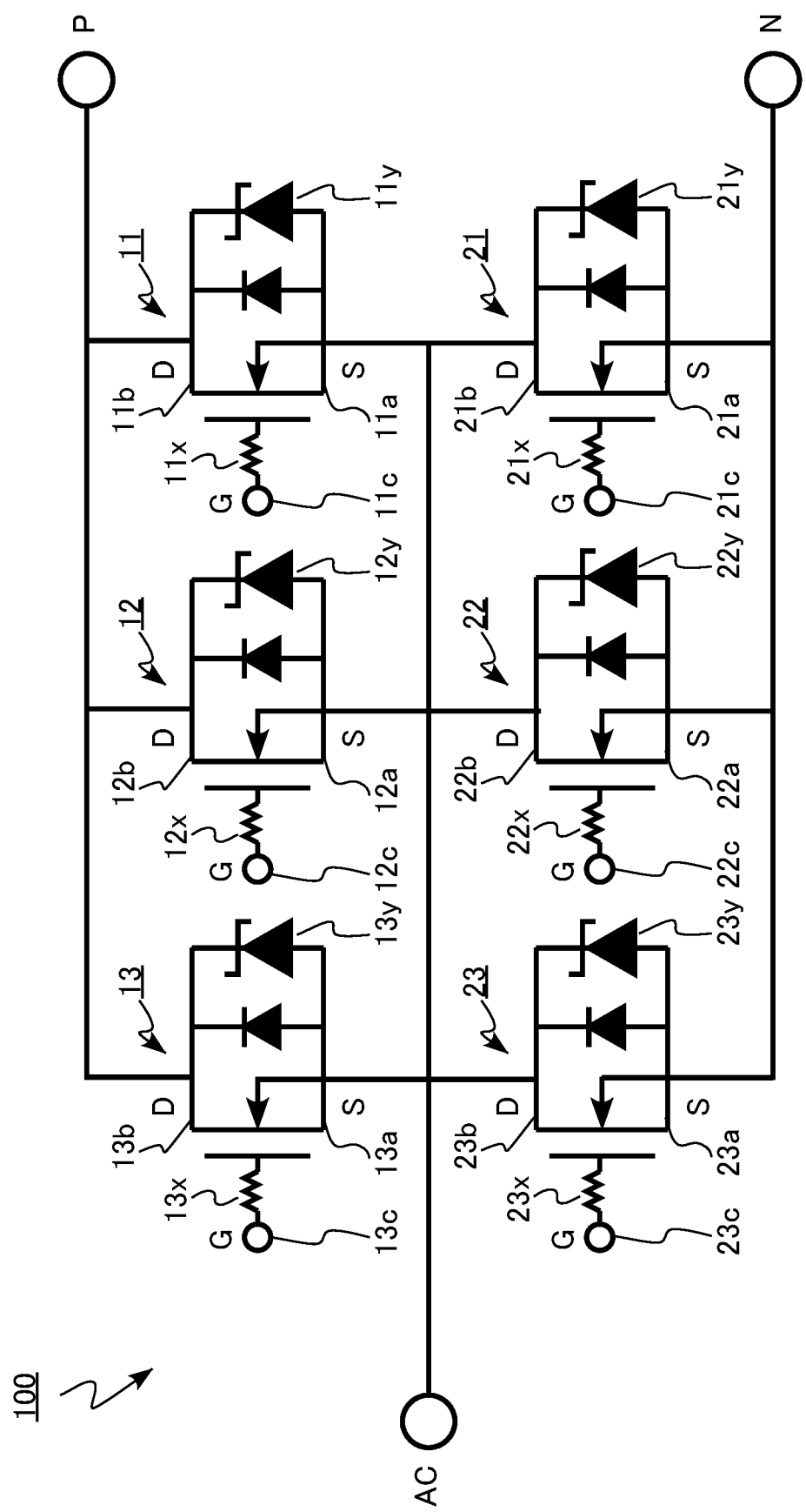
FIG. 4 is an equivalent circuit diagram of the semiconductor device according to the first embodiment.

FIG. 1 is a schematic top view of the semiconductor device according to the first embodiment. FIG. 2 is a schematic cross-sectional view of the semiconductor device according to the first embodiment. FIG. 2 illustrates a cross section of AA' of FIG. 1. FIG. 3 is a schematic cross-sectional view of the semiconductor device according to the first embodiment. FIG. 3 illustrates a cross section of BB' of FIG. 1. FIG. 4 is an equivalent circuit diagram of the semiconductor device according to the first embodiment.

The semiconductor device according to the first embodiment is a power semiconductor module 100. As illustrated in FIG. 4, the power semiconductor module 100 according to the first embodiment is a so-called "2-in-1" type module in which a half-bridge circuit can be configured by one module. In the power semiconductor module 100, three half-bridge units are connected in parallel. For example, a three-phase inverter circuit can be configured by using the three power semiconductor modules according to the first embodiment.

As illustrated in FIG. 4, the power semiconductor module 100 includes a positive terminal P (first main terminal), a negative terminal N (second main terminal), an AC output terminal AC (output terminal), a high-side MOSFET 11, a high-side MOSFET 12, a high-side MOSFET 13, a low-side MOSFET 21, a low-side MOSFET 22, and a low-side MOSFET 23. Each MOSFET is embedded with a Schottky barrier diode (SBD) in addition to a pn junction diode. The SBD has, for example, a function of allowing a reflux current to flow. In addition, each MOSFET is embedded with a gate resistor.

The high-side MOSFET 11, the high-side MOSFET 12, and the high-side MOSFET 13 are connected in parallel. The low-side MOSFET 21, the low-side MOSFET 22, and the low-side MOSFET 23 are connected in parallel. The high-side MOSFET 11 and the low-side MOSFET 21 are connected in series, the high-side MOSFET 12 and the low-side MOSFET 22 are connected in series, and the high-side MOSFET 13 and the low-side MOSFET 23 are connected in series.

As illustrated in FIGS. 1, 2, and 3, the power semiconductor module 100 according to the first embodiment includes the positive terminal P (first main terminal), the negative terminal N (second main terminal), the AC output terminal AC (output terminal), the high-side MOSFET 11 (first semiconductor chip), the high-side MOSFET 12 (second semiconductor chip), the high-side MOSFET 13, the low-side MOSFET 21 (third semiconductor chip), the low-side MOSFET (fourth semiconductor chip), the low-side MOSFET 23, a resin case 24, a cover 26, a metal base 28, an insulating substrate 30, a first metal layer 31, a second metal layer 32, a third metal layer 33, a first gate metal layer 36, a second gate metal layer 37, a rear surface metal layer 40, a first gate terminal 41, a second gate terminal 42, a bonding wire 44, and a sealing resin 50.

The high-side MOSFET 11 (first semiconductor chip) includes a source electrode 11a (first upper electrode), a drain electrode 11b (first lower electrode), a gate electrode 11c (first gate electrode), and a gate resistor 11x (first gate resistor), and a Schottky barrier diode 11y (first Schottky barrier diode). The high-side MOSFET 12 (second semiconductor chip) includes a source electrode 12a (second upper electrode), a drain electrode 12b (second lower electrode), a gate electrode 12c (second gate electrode), a gate resistor 12x (second gate resistor), and a Schottky barrier diode 12y (second Schottky barrier diode). The high-side MOSFET 13 includes a source electrode 13a, a drain electrode 13b, a gate electrode 13c, a gate resistor 13x, and a Schottky barrier diode 13y.

The low-side MOSFET 21 (third semiconductor chip) includes a source electrode 21a (third upper electrode), a drain electrode 21b (third lower electrode), a gate electrode 21c (third gate electrode), a gate resistor 21x (third gate resistor), and a Schottky barrier diode 21y (third Schottky barrier diode). The low-side MOSFET 22 (fourth semiconductor chip) includes a source electrode 22a (fourth upper electrode), a drain electrode 22b (fourth lower electrode), a gate electrode 22c (fourth gate electrode), a gate resistor 22x (fourth gate resistor), and a Schottky barrier diode 22y (fourth Schottky barrier diode). The low-side MOSFET 23 includes a source electrode 23a, a drain electrode 23b, a gate electrode 23c, a gate resistor 23x (first gate resistor), and a Schottky barrier diode 23y (first Schottky barrier diode).

The first metal layer 31 includes a first region 31a. The second metal layer 32 includes a second region 32a, a third region 32b, a fourth region 32c, a first slit 32x, a first end E1, and a second end E2. The third metal layer 33 includes a fifth region 33a, a sixth region 33b, a seventh region 33c, a third end E3, and a fourth end E4.

FIG. 1 is a top view of a state of the power semiconductor module 100 in which the cover 26 and the sealing resin 50 are removed.

The metal base 28 is made of, for example, copper. For example, at the time of mounting the power semiconductor module 100 on a product, a heat dissipation plate (not illustrated) is connected to a rear surface of the metal base 28.

The insulating substrate 30 is provided on the metal base 28. The insulating substrate 30 is provided between the metal base 28 and the high-side MOSFET 11, between the metal base 28 and the high-side MOSFET 12, between the metal base 28 and the high-side MOSFET 13, between the metal base 28 and the low-side MOSFET 21, between the metal base 28 and the low-side MOSFET 22, and between the metal base 28 and the low-side MOSFET 23.

The insulating substrate 30 has a function of electrically separating the metal base 28 and the high-side MOSFET 11, the metal base 28 and the high-side MOSFET 12, the metal base 28 and the high-side MOSFET 13, the metal base 28 and the low-side MOSFET 21, the metal base 28 and the low-side MOSFET 22, and the metal base 28 and the low-side MOSFET 23.

The insulating substrate 30 is made of, for example, a ceramic. The insulating substrate 30 is made of, for example, an aluminum oxide, an aluminum nitride, or a silicon nitride.

The first metal layer 31, the second metal layer 32, the third metal layer 33, the first gate metal layer 36, and the second gate metal layer 37 are provided on the surface of the insulating substrate 30. The first metal layer 31, the second metal layer 32, the third metal layer 33, the first gate metal layer 36, and the second gate metal layer 37 are made of, for example, copper.

The rear surface metal layer 40 is provided on the rear surface of the insulating substrate 30. The rear surface metal layer 40 is made of, for example, copper. The rear surface metal layer 40 is bonded to the metal base 28 by using, for example, a solder layer or a silver nanoparticle layer (not illustrated).

The resin case 24 is provided around the metal base 28 and the insulating substrate 30. A portion of the resin case 24 is provided on the metal base 28. The resin case 24 has a function of protecting the high-side MOSFET 11, the high-side MOSFET 12, the high-side MOSFET 13, the low-side MOSFET 21, the low-side MOSFET 22, the low-side MOSFET 23, and the insulating substrate 30.

The cover 26 is provided on the resin case 24. The cover 26 has a function of protecting the high-side MOSFET 11, the high-side MOSFET 12, the high-side MOSFET 13, the low-side MOSFET 21, the low-side MOSFET 22, the low-side MOSFET 23, and the insulating substrate 30.

The high-side MOSFET 11 is provided on the first metal layer 31. The high-side MOSFET 11 includes the source electrode 11a, the drain electrode 11b, the gate electrode 11c, the gate resistor 11x, and the Schottky barrier diode 11y. The source electrode 11a is an example of the first upper electrode. The drain electrode 11b is an example of the first lower electrode. The gate electrode 11c is an example of the first gate electrode. The gate resistor 11x is an example of the first gate resistor. The Schottky barrier diode 11y is an example of the first Schottky barrier diode.

The source electrode 11a is electrically connected to the fifth region 33a of the third metal layer 33. The source electrode 11a and the fifth region 33a are electrically connected by using, for example, the bonding wire 44. The drain electrode 11b is electrically connected to the first metal layer 31. The drain electrode 11b is electrically connected to the first metal layer 31 by using, for example, a solder layer or a silver nanoparticle layer (not illustrated).

The high-side MOSFET 12 is provided on the first metal layer 31. A distance from the first region 31a to the high-side MOSFET 12 is larger than a distance from the first region 31a to the high-side MOSFET 11. A distance between the first region 31a and the high-side MOSFET 12 is larger than a distance between the first region 31a and the high-side MOSFET 11.

The high-side MOSFET 12 includes the source electrode 12a, the drain electrode 12b, the gate electrode 12c, the gate resistor 12x, and the Schottky barrier diode 12y. The source electrode 12a is an example of the second upper electrode. The drain electrode 12b is an example of the second lower electrode. The gate electrode 12c is an example of the second gate electrode. The gate resistor 12x is an example of the second gate resistor. The Schottky barrier diode 12y is an example of the second Schottky barrier diode.

The source electrode 12a is electrically connected to the sixth region 33b of the third metal layer 33. The source electrode 12a and the sixth region 33b are electrically connected by using, for example, the bonding wire 44. The drain electrode 12b is electrically connected to the first metal layer 31. The drain electrode 12b is electrically connected to the first metal layer 31 by using, for example, a solder layer or a silver nanoparticle layer (not illustrated).

The high-side MOSFET 13 is provided on the first metal layer 31. A distance from the first region 31a to the high-side MOSFET 13 is larger than a distance from the first region 31a to the high-side MOSFET 12.

The high-side MOSFET 13 includes the source electrode 13a, the drain electrode 13b, the gate electrode 13c, the gate resistor 13x, and the Schottky barrier diode 13y.

The source electrode 13a is electrically connected to the third metal layer 33. The source electrode 13a and the third metal layer 33 are electrically connected by using, for example, the bonding wire 44. The drain electrode 13b is electrically connected to the first metal layer 31. The drain electrode 13b is electrically connected to the first metal layer 31 by using, for example, a solder layer or a silver nanoparticle layer (not illustrated).

The low-side MOSFET 21 is provided on the third metal layer 33. The low-side MOSFET 21 includes the source electrode 21a, the drain electrode 21b, the gate electrode 21c, the gate resistor 21x, and the Schottky barrier diode 21y. The source electrode 21a is an example of the third upper electrode. The drain electrode 21b is an example of the third lower electrode. The gate electrode 21c is an example of the third gate electrode. The gate resistor 21x is an example of the third gate resistor. The Schottky barrier diode 21y is an example of the third Schottky barrier diode.

The source electrode 21a is electrically connected to the third region 32b of the second metal layer 32. The source electrode 21a and the third region 32b are electrically connected by using, for example, the bonding wire 44. The drain electrode 21b is electrically connected to the third metal layer 33. The drain electrode 21b is electrically connected to the third metal layer 33 by using, for example, a solder layer or a silver nanoparticle layer (not illustrated).

The low-side MOSFET 22 is provided on the third metal layer 33. A distance from the fifth region 33a to the low-side MOSFET 22 is larger than a distance from the fifth region 33a to the low-side MOSFET 21. A distance between the fifth region 33a and the low-side MOSFET 22 is larger than a distance between the fifth region 33a and the low-side MOSFET 21.

The low-side MOSFET 22 includes the source electrode 22a, the drain electrode 22b, the gate electrode 22c, the gate resistor 22x, and the Schottky barrier diode 22y. The source electrode 22a is an example of the fourth upper electrode. The drain electrode 22b is an example of the fourth lower electrode. The gate electrode 22c is an example of the fourth gate electrode. The gate resistor 22x is an example of the fourth gate resistor. The Schottky barrier diode 22y is an example of the fourth Schottky barrier diode.

The source electrode 22a is electrically connected to the fourth region 32c of the second metal layer 32. The source electrode 22a and the fourth region 32c are electrically connected by using, for example, the bonding wire 44. The drain electrode 22*b* is electrically connected to the third metal layer 33. The drain electrode 22*b* is electrically connected to the third metal layer 33 by using, for example, a solder layer or a silver nanoparticle layer (not illustrated).

The low-side MOSFET 23 is provided on the third metal layer 33. A distance from the fifth region 33*a* to the low-side MOSFET 23 is larger than a distance from the fifth region 33*a* to the low-side MOSFET 22.

The low-side MOSFET 23 includes the source electrode 23*a*, the drain electrode 23*b*, the gate electrode 23*c*, the gate resistor 23*x*, and the Schottky barrier diode 23*y*.

The source electrode 23*a* is electrically connected to the second metal layer 32. The source electrode 22*a* and the second metal layer 32 are electrically connected by using, for example, the bonding wire 44. The drain electrode 23*b* is electrically connected to the third metal layer 33. The drain electrode 23*b* is electrically connected to the third metal layer 33 by using, for example, a solder layer or a silver nanoparticle layer (not illustrated).

The high-side MOSFET 11, the high-side MOSFET 12, the high-side MOSFET 13, the low-side MOSFET 21, the low-side MOSFET 22, and the low-side MOSFET 23 are formed by using, for example, silicon carbide (SiC). The high-side MOSFET 11, the high-side MOSFET 12, the high-side MOSFET 13, the low-side MOSFET 21, the low-side MOSFET 22, and the low-side MOSFET 23 contain the silicon carbide. Each of the high-side MOSFET 11, the high-side MOSFET 12, the high-side MOSFET 13, the low-side MOSFET 21, the low-side MOSFET 22, and the low-side MOSFET 23 includes a silicon carbide layer (not illustrated).

The resin case 24 is filled with the sealing resin 50. The sealing resin 50 is surrounded by the resin case 24. The sealing resin 50 covers the high-side MOSFET 11, the high-side MOSFET 12, the high-side MOSFET 13, the low-side MOSFET 21, the low-side MOSFET 22, the low-side MOSFET 23, and the insulating substrate 30.

The sealing resin 50 has a function of protecting the high-side MOSFET 11, the high-side MOSFET 12, the high-side MOSFET 13, the low-side MOSFET 21, the low-side MOSFET 22, the low-side MOSFET 23, and the insulating substrate 30. In addition, the sealing resin 50 also has a function of insulating the high-side MOSFET 11, the high-side MOSFET 12, the high-side MOSFET 13, the low-side MOSFET 21, the low-side MOSFET 22, the low-side MOSFET 23, and the insulating substrate 30.

The sealing resin 50 contains a resin. The sealing resin 50 is, for example, a silicone gel. For example, other resins such as an epoxy resin and a polyimide resin can be applied to the sealing resin 50.

The positive terminal P is provided on one end side of the insulating substrate 30. For example, in FIG. 1, the positive terminal P is provided on the right side of the insulating substrate 30. The positive terminal P has a wiring connection hole.

The positive terminal P is electrically connected to the first metal layer 31. The positive terminal P is electrically connected to the first region 31*a* of the first metal layer 31. The positive terminal P is electrically connected to the first region 31*a* by using, for example, the bonding wire 44.

For example, the positive terminal P is applied with a positive voltage from the outside.

The positive terminal P is made of a metal. The positive terminal P is made of, for example, copper.

The negative terminal N is provided on one end side of the insulating substrate 30. The negative terminal N is provided on the same side of the insulating substrate 30 as the positive terminal P. For example, in FIG. 1, the negative terminal N is provided on the right side of the insulating substrate 30. The negative terminal N has a wiring connection hole.

The negative terminal N is electrically connected to the second metal layer 32. The negative terminal N is electrically connected to the second region 32*a* of the second metal layer 32. The negative terminal N is electrically connected to the second region 32*a* by using, for example, the bonding wire 44.

For example, the negative terminal N is applied with a negative voltage from the outside.

The negative terminal N is made of a metal. The negative terminal N is made of, for example, copper.

The AC output terminal AC is provided on the other end side of the insulating substrate 30. The AC output terminal AC is provided on the opposite side of the positive terminal P and the negative terminal N with the insulating substrate 30 interposed therebetween. In FIG. 1, the AC output terminal AC is provided on the left side of the insulating substrate 30. The AC output terminal AC has a wiring connection hole. FIG. 1 illustrates a case where there are two AC output terminals AC.

The AC output terminal AC is electrically connected to the third metal layer 33. The AC output terminal AC is electrically connected to the seventh region 33*c* of the third metal layer 33. The AC output terminal AC is electrically connected to the seventh region 33*c* by using, for example, the bonding wire 44.

The AC output terminal AC outputs an output current of the half-bridge circuit.

The first gate terminal 41 is electrically connected to the gate electrode 11*c* of the high-side MOSFET 11. The first gate terminal 41 is electrically connected to the gate electrode 11*c* by using, for example, the first gate metal layer 36 and the bonding wire 44. No gate resistance component is provided between the first gate terminal 41 and the gate electrode 11*c*. An electric resistance between the first gate terminal 41 and the gate electrode 11*c* is, for example, 5Ω or less.

The first gate terminal 41 is electrically connected to the gate electrode 12*c* of the high-side MOSFET 12. The first gate terminal 41 is electrically connected to the gate electrode 12*c* by using, for example, the first gate metal layer 36 and the bonding wire 44. No gate resistance component is provided between the first gate terminal 41 and the gate electrode 12*c*. An electric resistance between the first gate terminal 41 and the gate electrode 12*c* is, for example, 5Ω or less.

The first gate terminal 41 is electrically connected to the gate electrode 13*c* of the high-side MOSFET 13. The first gate terminal 41 is electrically connected to the gate electrode 13*c* by using, for example, the first gate metal layer 36 and the bonding wire 44. No gate resistance component is provided between the first gate terminal 41 and the gate electrode 13*c*. An electric resistance between the first gate terminal 41 and the gate electrode 13*c* is, for example, 5Ω or less.

The second gate terminal 42 is electrically connected to the gate electrode 21*c* of the low-side MOSFET 21. The second gate terminal 42 is electrically connected to the gate electrode 21*c* by using, for example, the second gate metal layer 37 and the bonding wire 44. No gate resistance component is provided between the second gate terminal 42 and the gate electrode 21*c*. An electric resistance between the second gate terminal 42 and the gate electrode 21*c* is, for example, 5Ω or less.

The second gate terminal 42 is electrically connected to the gate electrode 22c of the low-side MOSFET 22. The second gate terminal 42 is electrically connected to the gate electrode 22c by using, for example, the second gate metal layer 37 and the bonding wire 44. No gate resistance component is provided between the second gate terminal 42 and the gate electrode 22c. An electric resistance between the second gate terminal 42 and the gate electrode 22c is, for example, 5Ω or less.

The second gate terminal 42 is electrically connected to the gate electrode 23c of the low-side MOSFET 23. The second gate terminal 42 is electrically connected to the gate electrode 23c by using, for example, the second gate metal layer 37 and the bonding wire 44. No gate resistance component is provided between the second gate terminal 42 and the gate electrode 23c. An electric resistance between the second gate terminal 42 and the gate electrode 23c is, for example, 5Ω or less.

The first metal layer 31 is provided on the insulating substrate 30. The first metal layer 31 includes the first region 31a. The first metal layer 31 is electrically connected to the positive terminal P in the first region 31a.

The second metal layer 32 is provided on the insulating substrate 30. The second metal layer 32 includes the second region 32a, the third region 32b, and the fourth region 32c. The second metal layer 32 is electrically connected to the negative terminal N in the second region 32a. The second metal layer 32 is electrically connected to the source electrode 21a of the low-side MOSFET 21 in the third region 32b. The second metal layer 32 is electrically connected to the source electrode 22a of the low-side MOSFET 22 in the fourth region 32c.

The second metal layer 32 includes the first end E1 and the second end E2. The first end E1 is an end portion on a side facing the third metal layer 33. The second end E2 is an end portion opposite to the first end E1 with the second metal layer 32 interposed therebetween.

The second metal layer 32 includes the first slit 32x. The first slit 32x is disposed between the third region 32b and the second end E2. The first slit 32x extends, for example, in a first direction from the low-side MOSFET 21 toward the low-side MOSFET 22.

For example, a first distance (d1 in FIG. 1) between the first end E1 and the first slit 32x is smaller than a second distance (d2 in FIG. 1) between the first slit 32x and the second end E2. For example, the first distance d1 is 80% or less of the second distance d2.

The first slit 32x has a function of increasing a parasitic inductance of the wiring of the low-side MOSFET 21.

A length (L1 in FIG. 1) of the first slit 32x in the first direction is larger than, for example, a length (L2 in FIG. 1) of the low-side MOSFET 21 in the first direction. For example, the length L1 of the first slit 32x is 120% or more and 400% or less of the length L2 of the low-side MOSFET 21.

A region including the first slit 32x between the third region 32b and the second end E2 has a lower density of the metal layer than that between the fourth region 32c and the second end E2.

The third metal layer 33 is provided on the insulating substrate 30. The third metal layer 33 includes the fifth region 33a, the sixth region 33b, and the seventh region 33c. The third metal layer 33 is electrically connected to the source electrode 11a of the high-side MOSFET 11 in the fifth region 33a. The third metal layer 33 is electrically connected to the source electrode 12a of the high-side MOSFET 12 in the sixth region 33b. The third metal layer 33 is electrically connected to the AC output terminal AC in the seventh region 33c.

The third metal layer 33 includes the third end E3 and the fourth end E4. The third end E3 is an end portion on a side facing the first metal layer 31. The fourth end E4 is an end portion opposite to the third end E3 with the third metal layer 33 interposed therebetween. The fourth end E4 is an end portion on a side facing the second metal layer 32.

Next, functions and effects of the power semiconductor module 100 according to the first embodiment will be described.

In a power semiconductor module, in order to reduce power consumption, it is desired to reduce a switching time and, thus, to reduce a switching loss. In a case where the power semiconductor chip includes a MOSFET having a unipolar operation, for example, a switching time can be shortened as compared with a case where the power semiconductor chip includes an insulated gate bipolar transistor (IGBT) having a bipolar operation.

Figure 5:
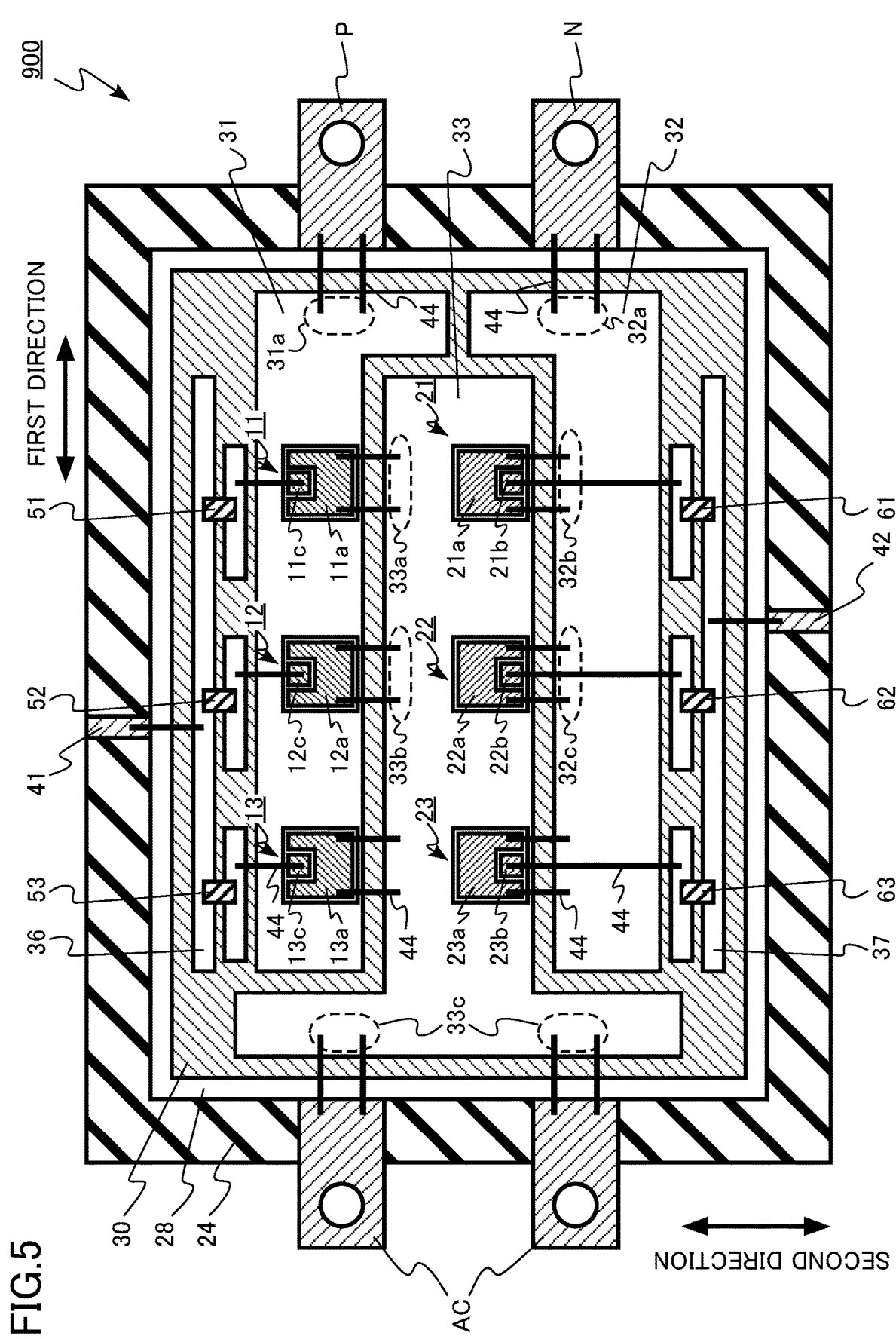
FIG. 5 is a schematic top view of a semiconductor device according to Comparative Example.

FIG. 5 is a schematic top view of a semiconductor device according to Comparative Example. FIG. 5 is a diagram corresponding to FIG. 1.

The semiconductor device according to Comparative Example is a power semiconductor module 900. The power semiconductor module 900 according to Comparative Example is different from the power semiconductor module 100 according to the first embodiment in that the second metal layer 32 does not include the first slit 32x.

In addition, the power semiconductor module 900 according to Comparative Example is different from the power semiconductor module 100 according to the first embodiment in that a gate resistance component is provided on the insulating substrate 30. That is, the power semiconductor module 900 includes a first gate resistor 51, a second gate resistor 52, a third gate resistor 53, a fourth gate resistor 61, a fifth gate resistor 62, and a sixth gate resistor 63. The first gate resistor 51, the second gate resistor 52, the third gate resistor 53, the fourth gate resistor 61, the fifth gate resistor 62, and the sixth gate resistor 63 have, for example, more than 5Ω, respectively.

The first gate resistor 51 is electrically connected between a first gate terminal 41 and a high-side MOSFET 11. The second gate resistor 52 is electrically connected between the first gate terminal 41 and a high-side MOSFET 12. The third gate resistor 53 is electrically connected between the first gate terminal 41 and a high-side MOSFET 13.

The fourth gate resistor 61 is electrically connected between a second gate terminal 42 and a low-side MOSFET 21. The fifth gate resistor 62 is electrically connected between the second gate terminal 42 and a low-side MOSFET 22. The sixth gate resistor 63 is electrically connected between the second gate terminal 42 and a low-side MOSFET 23.

The first gate resistor 51, the second gate resistor 52, the third gate resistor 53, the fourth gate resistor 61, the fifth gate resistor 62, and the sixth gate resistor 63 has a function of suppressing an inrush current applied to the gate electrodes of each MOSFET and, thus, suppressing ringing of an output of the power semiconductor module 900.

Similarly to the power semiconductor module 100, in the power semiconductor module 900, the high-side MOSFET 11, the high-side MOSFET 12, and the high-side MOSFET 13 are connected in parallel. In addition, similarly to the power semiconductor module 100, in the power semiconductor module 900, the low-side MOSFET 21, the low-side MOSFET 22, and the low-side MOSFET 23 are connected in parallel.

For example, in the power semiconductor module 900, a wiring length from a negative terminal N to the MOSFET increases in the order of the low-side MOSFET 21, the low-side MOSFET 22, and the low-side MOSFET 23. For this reason, a parasitic inductance of the MOSFET wiring increases in the order of the low-side MOSFET 21, the low-side MOSFET 22, and the low-side MOSFET 23.

When the parasitic inductances of the MOSFETs arranged in parallel are different, at the time of switching the power semiconductor module 900, a variation in surge voltage generated at a voltage (hereinafter referred to as a gate voltage) between a gate electrode and a source electrode of each MOSFET occurs. In addition, when the parasitic inductances of the MOSFETs arranged in parallel are different, at the time of switching the power semiconductor module 900, for example, a variation in surge current flowing through an SBD embedded with each MOSFET occurs.

For example, when the high-side MOSFET is turned on, a variation in surge voltage generated in the gate voltage of the low-side MOSFET in the off state occurs. For example, when a positive surge voltage is applied to the gate electrode, there is a concern that there occurs a problem that a breakthrough caused by unintended turn-on may occur in the power semiconductor module 900 and a through current may flow. When the through current flows, there is a concern that, for example, the power semiconductor module 900 may be destructed by heat generation.

In addition, for example, when a negative surge voltage is applied to the gate electrode, there is a concern that there occurs a problem that a gate insulating film of the MOSFET may be destructed. When the gate insulating film of the MOSFET is destructed, the power semiconductor module 900 is destructed.

For example, in the power semiconductor module 900, the positive surge voltage is likely to be applied to the low-side MOSFET 21 close to the negative terminal N. In addition, for example, the negative surge voltage is likely to be applied to the low-side MOSFET 23 far from the negative terminal N.

In addition, for example, when a high-side MOSFET is turned off, a variation in magnitude of the surge current flowing through the SBD of the low-side MOSFET in the off state occurs. When the surge current flowing through the SBD increases, there is a concern that a current flowing through the pn junction diode of the MOSFET may increase. In a case where the MOSFET is formed by using silicon carbide, when a current flows through the pn junction diode that has a bipolar operation, there is a concern that an increase in on-resistance of the MOSFET may occur with the growth of stacking faults. Since the on-resistance of the MOSFET increases, there is a concern that the reliability of the power semiconductor module 900 may decrease.

For example, in the power semiconductor module 900, the surge current flowing through the embedded SBD of the low-side MOSFET 21 close to the negative terminal N is likely to be larger than the surge current flowing through the SBD of the low-side MOSFET 22 or the surge current flowing through the SBD of the low-side MOSFET 23.

As described above, in the power semiconductor module 900, due to the variation in parasitic inductance of the wirings of the MOSFETs arranged in parallel, destruction of the power semiconductor module 900 at the time of switching and deterioration of the reliability are likely to occur. For example, by reducing the switching speed of the power semiconductor module 900, the surge voltage and the surge current are reduced, so that the above-mentioned problem can be solved. However, when the switching speed decreases, the switching loss of the power semiconductor module 900 increases.

In the power semiconductor module 100 according to the first embodiment, the second metal layer 32 includes the first slit 32x. Since the first slit 32x is provided, the effective wiring length between the low-side MOSFET 21 closest to the negative terminal N and the negative terminal N increases as compared with that of the power semiconductor module 900 according to Comparative Example. For this reason, the parasitic inductance of the wiring between the low-side MOSFET 21 and the negative terminal N increases as compared with that of the power semiconductor module 900 according to Comparative Example. Therefore, the variation in parasitic inductance of the wirings of the MOSFETs arranged in parallel is reduced, and thus, the destruction of the power semiconductor module 100 at the time of switching and the deterioration of the reliability are suppressed. Therefore, the switching loss of the power semiconductor module 100 is reduced.

From the viewpoint of reducing the variation in parasitic inductance of the MOSFETs arranged in parallel, it is preferable that the first distance (d1 in FIG. 1) between the first end E1 and the first slit 32x is smaller than the second distance (d2 in FIG. 1) between the first slit 32x and the second end E2. The first distance d1 is preferably 80% or less, more preferably 60% or less of the second distance d2.

From the viewpoint of reducing the variation in parasitic inductance of the MOSFETs arranged in parallel, it is preferable that the length (L1 in FIG. 1) of the first slit 32x in the first direction is larger than the length (L2 in FIG. 1) of the low-side MOSFET 21 in the first direction. The length L1 of the first slit 32x is preferably 120% or more, more preferably 150% or more of the length L2 of the low-side MOSFET 21.

In addition, the power semiconductor module 100 according to the first embodiment does not include a gate resistance component. Since no gate resistance component is provided, a space for providing the gate resistance component on the insulating substrate 30 becomes unnecessary. For this reason, for example, the width of the first metal layer 31, the second metal layer 32, or the third metal layer 33 in the second direction can be allowed to be larger than that of the power semiconductor module 900 according to Comparative Example. Therefore, it is possible to reduce the parasitic inductance of the power semiconductor module 100 and to reduce the switching loss of the power semiconductor module 100.

In addition, in the power semiconductor module 100 according to the first embodiment, by allowing each MOSFET to be embedded with the gate resistor in the chip, the inrush current applied to each MOSFET is suppressed, and thus, the ringing of the output of the power semiconductor module 100 is suppressed.

The power semiconductor module 100 does not include a gate resistance component. Therefore, an electric resistance between the first gate terminal 41 and the gate electrode of each high-side MOSFET is, for example, 5Ω or less. In addition, an electric resistance between the second gate terminal 42 and the gate electrode of each low-side MOSFET is, for example, 5Ω or less.

As described above, according to the first embodiment, by reducing the variation in parasitic inductance of the power semiconductor chips arranged in parallel, it is possible to reduce the switching loss of the power semiconductor module.

Second Embodiment

A semiconductor device according to a second embodiment is different from the semiconductor device according to the first embodiment in that the third metal layer has a third end on a side facing the first metal layer and a fourth end on a side opposite to the third end and includes a second slit disposed between the fifth region and the fourth end. Hereinafter, some descriptions of the contents overlapping with the first embodiment will be omitted.

Figure 6:
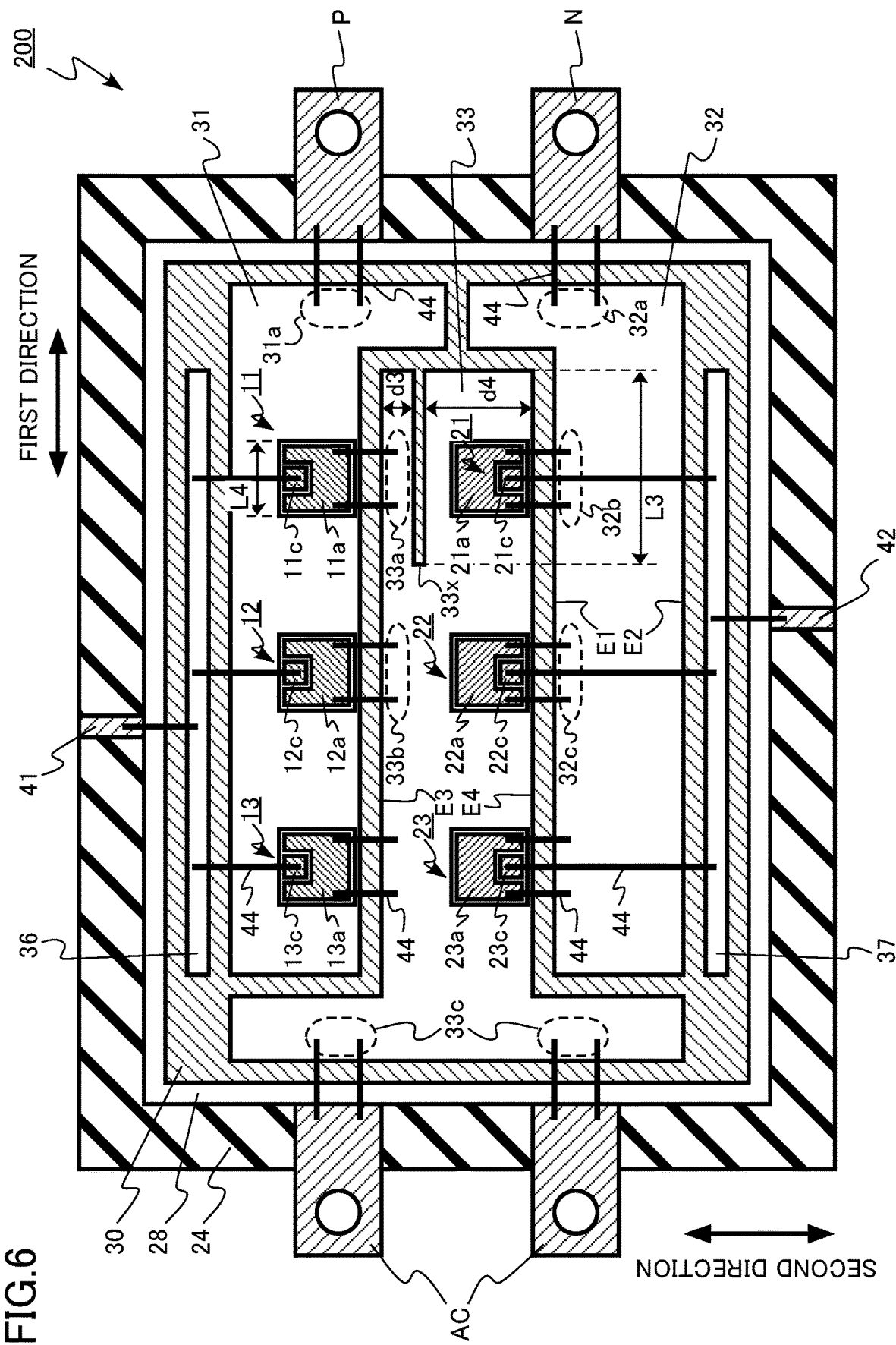
FIG. 6 is a schematic top view of a semiconductor device according to a second embodiment.

FIG. 6 is a schematic top view of the semiconductor device according to the second embodiment. FIG. 6 is a diagram corresponding to FIG. 1 of the first embodiment.

The semiconductor device according to the second embodiment is a power semiconductor module 200. The power semiconductor module 200 according to the second embodiment is a so-called "2-in-1" type module in which a half-bridge circuit can be configured by one module. In the power semiconductor module 200, three half-bridge units are connected in parallel.

A third metal layer 33 is provided on an insulating substrate 30. The third metal layer 33 includes a fifth region 33a, a sixth region 33b, and a seventh region 33c. The third metal layer 33 is electrically connected to a source electrode 11a of a high-side MOSFET 11 in a fifth region 33a. The third metal layer 33 is electrically connected to a source electrode 12a of a high-side MOSFET 12 in a sixth region 33b. The third metal layer 33 is electrically connected to an AC output terminal AC in a seventh region 33c.

The third metal layer 33 includes a third end E3 and a fourth end E4. The third end E3 is an end portion on a side facing a first metal layer 31. The fourth end E4 is an end portion opposite to the third end E3 with the third metal layer 33 interposed therebetween. The fourth end E4 is an end portion on a side facing a second metal layer 32.

The third metal layer 33 includes a second slit 33x. The second slit 33x is disposed between a fifth region 33a and a fourth end E4. The second slit 33x extends, for example, in a first direction from a low-side MOSFET 21 toward a low-side MOSFET 22.

For example, a third distance (d3 in FIG. 6) between the third end E3 and the second slit 33x is smaller than a fourth distance (d4 in FIG. 6) between the second slit 33x and the fourth end E4. For example, the third distance d3 is 80% or less of the fourth distance d4.

The second slit 33x has a function of increasing a parasitic inductance of the wiring of the high-side MOSFET 11.

A length (L3 in FIG. 6) of the second slit 33x in the first direction is larger than, for example, a length (L4 in FIG. 6) of the high-side MOSFET 11 in the first direction. For example, the length L3 of the second slit 33x is 120% or more and 400% or less of the length L4 of the high-side MOSFET 11.

A region including the second slit 33x between the fifth region 33a and the fourth end E4 has a lower density of the metal layer than that between the sixth region 33b and the fourth end E4.

In the power semiconductor module 200 according to the second embodiment, since the second slit 33x is provided, a variation in parasitic inductance of wirings of the MOSFETs arranged in parallel is reduced. Therefore, destruction of the power semiconductor module 200 at the time of switching and deterioration of the reliability are suppressed. Therefore, a switching loss of the power semiconductor module 200 is reduced.

From the viewpoint of reducing the variation in parasitic inductance of the MOSFETs arranged in parallel, it is preferable that the third distance (d3 in FIG. 6) between the third end E3 and the second slit 33x is smaller than the fourth distance (d4 in FIG. 6) between the second slit 33x and the fourth end E4. The third distance d3 is preferably 80% or less, more preferably 60% or less of the fourth distance d4.

From the viewpoint of reducing the variation in parasitic inductance of the MOSFETs arranged in parallel, it is preferable that the length (L3 in FIG. 6) of the second slit 33x in the first direction is larger than the length (L4 in FIG. 6) of the high-side MOSFET 11 in the first direction. The length L3 of the second slit 33x is preferably 120% or more, more preferably 150% or more of the length L4 of the high-side MOSFET 11.

As described above, according to the second embodiment, similarly to the first embodiment, by reducing the variation in parasitic inductance of the power semiconductor chips arranged in parallel, it is possible to reduce the switching loss of the power semiconductor module.

Third Embodiment

A semiconductor device according to a third embodiment is different from the semiconductor device according to the first embodiment and the semiconductor device according to the second embodiment in that the second metal layer includes a first slit and the third metal layer includes a second slit. Hereinafter, the descriptions of the contents overlapping with the first embodiment and the second embodiment will be omitted.

Figure 7:
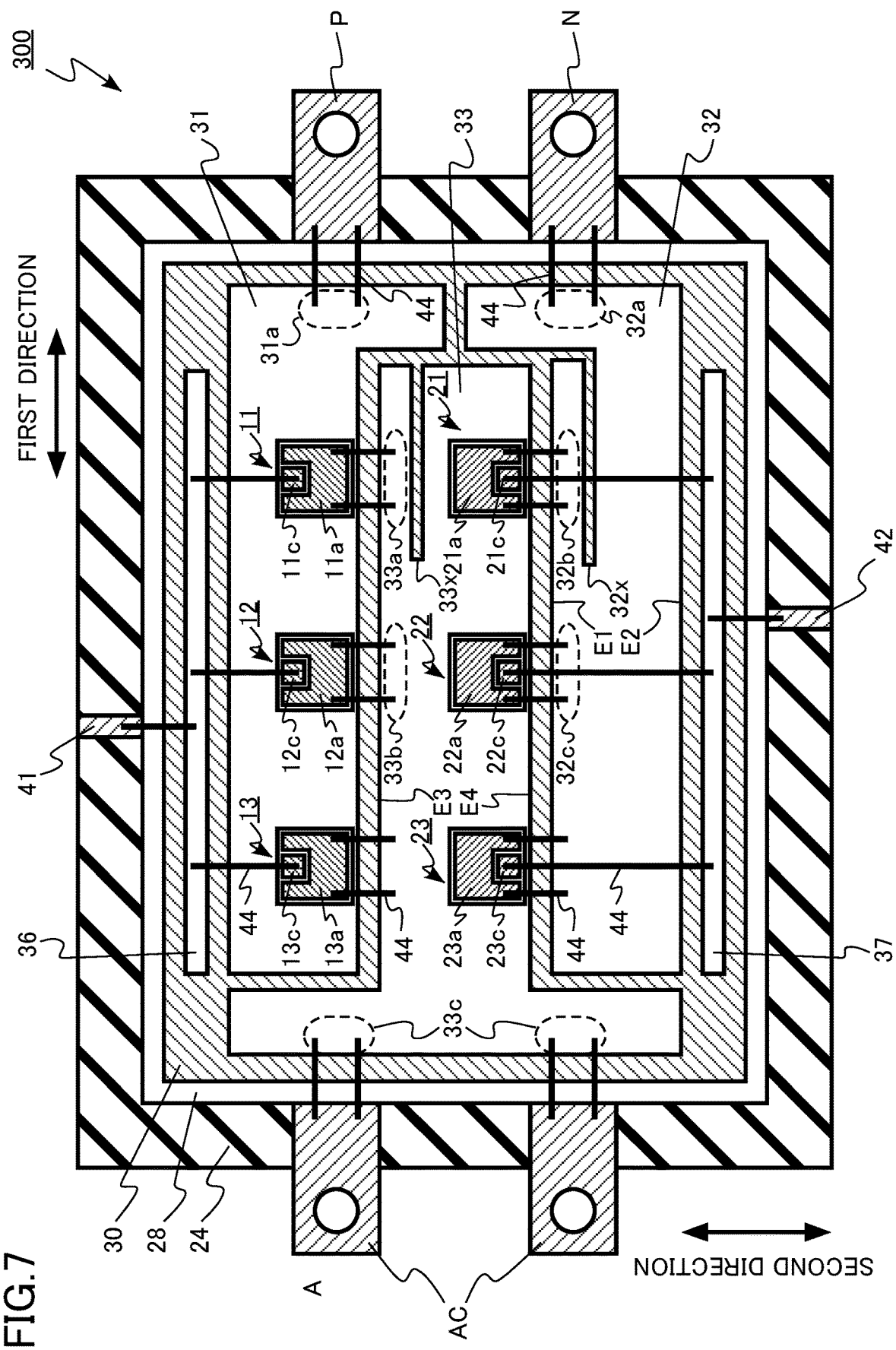
FIG. 7 is a schematic top view of a semiconductor device according to a third embodiment.

FIG. 7 is a schematic top view of the semiconductor device according to the third embodiment. FIG. 7 is a diagram corresponding to FIG. 1 of the first embodiment.

The semiconductor device according to the third embodiment is a power semiconductor module 300. The power semiconductor module 300 according to the third embodiment is a so-called "2-in-1" type module in which a half-bridge circuit can be configured by one module. In the power semiconductor module 300, three half-bridge units are connected in parallel.

A second metal layer 32 includes a first slit 32x. The first slit 32x is disposed between a third region 32b and a second end E2. The first slit 32x extends, for example, in a first direction from a low-side MOSFET 21 toward a low-side MOSFET 22.

A third metal layer 33 includes a second slit 33x. The second slit 33x is disposed between a fifth region 33a and a fourth end E4. The second slit 33x extends, for example, in the first direction from the low-side MOSFET 21 toward the low-side MOSFET 22.

In the power semiconductor module 300 according to the third embodiment, since the first slit 32x and the second slit 33x are provided, a variation in parasitic inductance of the wirings of the MOSFETs arranged in parallel is reduced. Therefore, destruction of the power semiconductor module 300 at the time of switching and deterioration of the reliability are suppressed. Therefore, a switching loss of the power semiconductor module 300 is reduced.

As described above, according to the third embodiment, similarly to the first embodiment and the second embodiment, by reducing the variation in parasitic inductance of the power semiconductor chips arranged in parallel, it is possible to reduce the switching loss of the power semiconductor module.

Fourth Embodiment

A semiconductor device according to a fourth embodiment includes: an insulating substrate having one end and the other end opposite to the one end; a first main terminal provided on a side of the one end; a second main terminal provided on the side of the one end; an output terminal provided on a side of the other end; a first metal layer provided on the insulating substrate, the first metal layer having a first region, and the first metal layer electrically connected to the first main terminal in the first region; a second metal layer provided on the insulating substrate, the second metal layer having a second region, a third region, and a fourth region, and the second metal layer electrically connected to the second main terminal in the second region; a third metal layer provided on the insulating substrate, the third metal layer disposed between the first metal layer and the second metal layer, the third metal layer having a fifth region, a sixth region, and a seventh region, and the third metal layer electrically connected to the output terminal in the seventh region; a first semiconductor chip including a first upper electrode, a first lower electrode, and a first gate electrode, and the first semiconductor chip provided on the first metal layer, the first upper electrode electrically connected to the fifth region, and the first lower electrode electrically connected to the first metal layer; a second semiconductor chip including a second upper electrode, a second lower electrode, and a second gate electrode, and the second semiconductor chip provided on the first metal layer, the second upper electrode is electrically connected to the sixth region, the second lower electrode electrically connected to the first metal layer, and a distance between the first region and the second semiconductor chip being larger than a distance between the first region and the first semiconductor chip; a third semiconductor chip including a third upper electrode, a third lower electrode, and a third gate electrode, and the third semiconductor chip provided on the third metal layer, the third upper electrode electrically connected to the third region, and the third lower electrode electrically connected to the third metal layer; and a fourth semiconductor chip including a fourth upper electrode, a fourth lower electrode, and a fourth gate electrode, and the fourth semiconductor chip provided on the third metal layer, the fourth upper electrode electrically connected to the fourth region, the fourth lower electrode electrically connected to the third metal layer, and a distance between the fifth region and the fourth semiconductor chip is larger than a distance between the fifth region and the third semiconductor chip. The second metal layer has a first end on a side facing the third metal layer and a second end on a side opposite to the first end, the second metal layer includes a first portion disposed between the third region and the second end and a second portion disposed between the fourth region and the second end, and a density of a metal layer in the first portion is lower than a density of a metal layer in the second portion, or the third metal layer has a third end on a side facing the first metal layer and a fourth end on a side opposite to the third end, the third metal layer includes a third portion disposed between the fifth region and the fourth end and a fourth portion disposed between the sixth region and the fourth end, and a density of a metal layer in the third portion is lower than a density of a metal layer in the fourth portion. The semiconductor device according to the fourth embodiment is different from the semiconductor device according to the first embodiment in that the first slit is replaced with a plurality of holes. Hereinafter, some descriptions of the contents overlapping with the first embodiment will be omitted.

Figure 8:
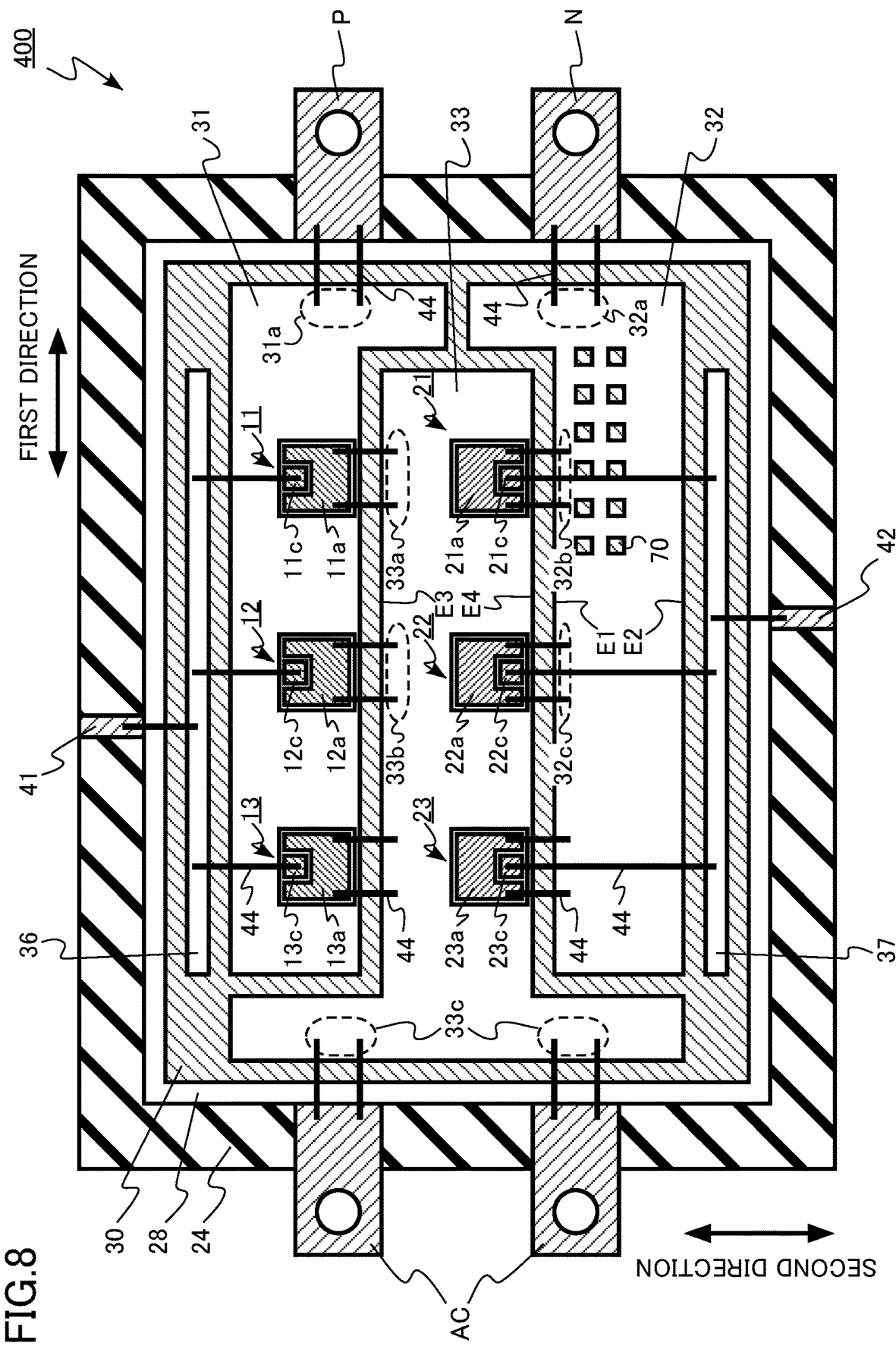
FIG. 8 is a schematic top view of a semiconductor device according to a fourth embodiment.

FIG. 8 is a schematic top view of the semiconductor device according to the fourth embodiment. FIG. 8 is a diagram corresponding to FIG. 1 of the first embodiment.

The semiconductor device according to the fourth embodiment is a power semiconductor module 400. The power semiconductor module 400 according to the fourth embodiment is a so-called "2-in-1" type module in which a half-bridge circuit can be configured by one module. In the power semiconductor module 400, three half-bridge units are connected in parallel.

A second metal layer 32 is provided on an insulating substrate 30. The second metal layer 32 includes a second region 32*a*, a third region 32*b*, and a fourth region 32*c*. The second metal layer 32 is electrically connected to a negative terminal N in the second region 32*a*. The second metal layer 32 is electrically connected to a source electrode 21*a* of a low-side MOSFET 21 in the third region 32*b*. The second metal layer 32 is electrically connected to a source electrode 22*a* of a low-side MOSFET 22 in the fourth region 32*c*.

The second metal layer 32 includes a first end E1 and a second end E2. The first end E1 is an end portion on a side facing a third metal layer 33. The second end E2 is an end portion opposite to the first end E1 with the second metal layer 32 interposed therebetween.

The second metal layer 32 includes a first portion. The first portion is disposed between the third region 32*b* and the second end E2. The first portion includes a plurality of holes 70. The plurality of holes 70 are disposed between the third region 32*b* and the second end E2.

The second metal layer 32 includes a second portion. The second portion is disposed between the fourth region 32*c* and the second end E2. A density of a metal layer in the first portion is lower than a density of a metal layer in the second portion, because of the plurality of holes 70 in the first portion.

The plurality of holes 70 have a function of increasing a parasitic inductance of wirings of the low-side MOSFET 21.

In the power semiconductor module 400 according to the fourth embodiment, since the plurality of holes 70 are provided in the second metal layer 32, a variation in parasitic inductance of wirings of the MOSFETs arranged in parallel is reduced. Therefore, destruction of the power semiconductor module 400 at the time of switching and deterioration of the reliability are suppressed.

Therefore, the switching loss of the power semiconductor module 400 is reduced.

Modified Example

Figure 9:
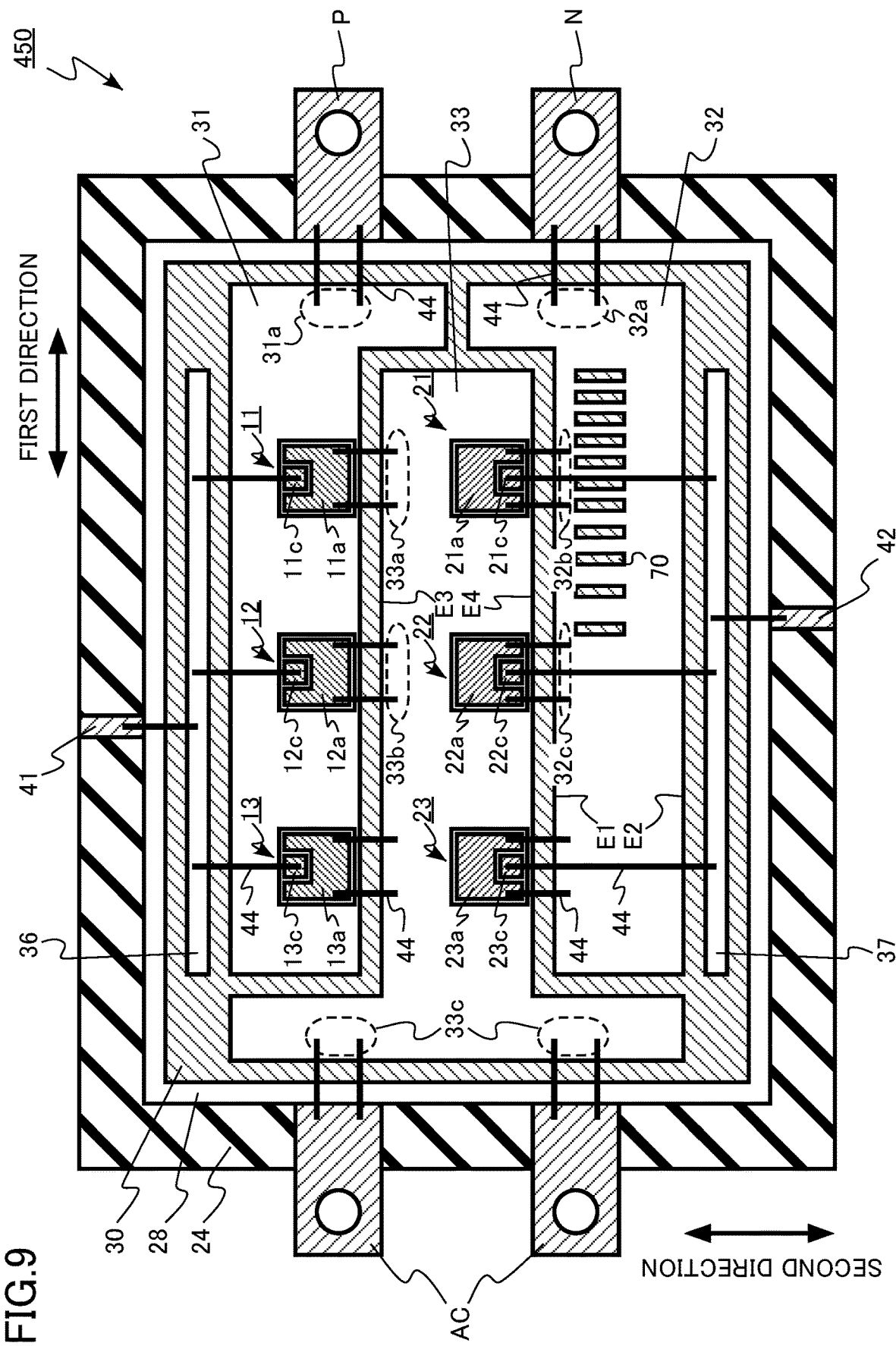
FIG. 9 is a schematic top view of a semiconductor device according to Modified Example of the fourth embodiment.

FIG. 9 is a schematic top view of a semiconductor device according to Modified Example of the fourth embodiment. FIG. 9 is a diagram corresponding to FIG. 8.

The semiconductor device according to Modified Example of the fourth embodiment is a power semiconductor module 450. The power semiconductor module 450 is different from the power semiconductor module 400 in terms of an arrangement pattern of the plurality of holes 70.

A density of a metal layer in the first portion is lower than a density of a metal layer in the second portion, because of the plurality of holes 70 in the first portion.

As described above, according to the fourth embodiment and Modified Example thereof, similarly to the first to third embodiments, by reducing the variation in parasitic inductance of the power semiconductor chips arranged in parallel, it is possible to reduce the switching loss of the power semiconductor module.

Fifth Embodiment

A semiconductor device according to a fifth embodiment is different from the semiconductor device according to the fourth embodiment in that the third metal layer has a third end on a side facing the first metal layer and a fourth end on a side opposite to the third end, the third metal layer includes a third portion disposed between the fifth region and the fourth end and a fourth portion disposed between the sixth region and the fourth end, and a density of a metal layer in the third portion is lower than a density of a metal layer in the fourth portion. Hereinafter, some descriptions of the contents overlapping with the fourth embodiment will be omitted.

Figure 10:
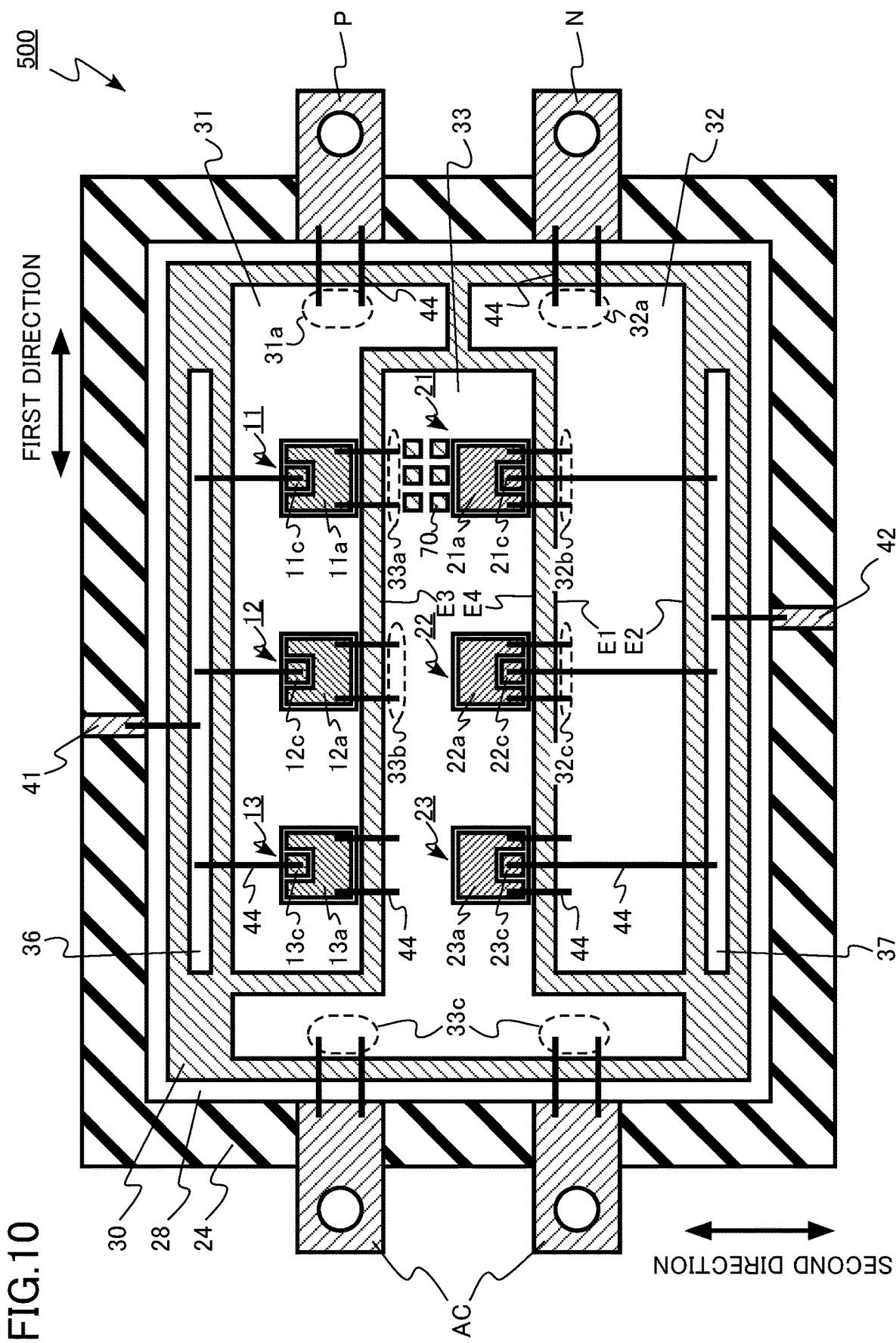
FIG. 10 is a schematic top view of a semiconductor device according to a fifth embodiment.

FIG. 10 is a schematic top view of the semiconductor device according to the fifth embodiment. FIG. 10 is a diagram corresponding to FIG. 8 of the fourth embodiment.

The semiconductor device according to the fifth embodiment is a power semiconductor module 500. The power semiconductor module 500 according to the fifth embodiment is a so-called "2-in-1" type module in which a half-bridge circuit can be configured by one module. In the power semiconductor module 500, three half-bridge units are connected in parallel.

A third metal layer 33 is provided on an insulating substrate 30. The third metal layer 33 includes a fifth region 33a, a sixth region 33b, and a seventh region 33c. The third metal layer 33 is electrically connected to a source electrode 11a of the high-side MOSFET 11 in the fifth region 33a. The third metal layer 33 is electrically connected to a source electrode 12a of the high-side MOSFET 12 in the sixth region 33b. The third metal layer 33 is electrically connected to an AC output terminal AC in the seventh region 33c.

The third metal layer 33 includes a third end E3 and a fourth end E4. The third end E3 is an end portion on a side facing a first metal layer 31. The fourth end E4 is an end portion opposite to the third end E3 with the third metal layer 33 interposed therebetween. The fourth end E4 is an end portion on a side facing a second metal layer 32.

The third metal layer 33 includes a third portion. The third portion is disposed between the fifth region 33a and the fourth end E4. The third portion includes a plurality of holes 70. The plurality of holes 70 are disposed between the fifth region 33a and the fourth end E4.

The third metal layer 33 includes a fourth portion. The fourth portion is disposed between the sixth region 33b and the fourth end E4. A density of a metal layer in the third portion is lower than a density of a metal layer in the fourth portion, because of the plurality of holes 70 in the third portion.

The plurality of holes 70 have a function of increasing a parasitic inductance of the wiring of the high-side MOSFET 11.

In the power semiconductor module 500 according to the fifth embodiment, since the plurality of holes 70 are provided in the third metal layer 33, a variation in parasitic inductance of wirings of the MOSFETs arranged in parallel is reduced. Therefore, destruction of the power semiconductor module 500 at the time of switching and deterioration of the reliability are suppressed. Therefore, a switching loss of the power semiconductor module 500 is reduced.

Modified Example

FIG. 11 is a schematic top view of a semiconductor device according to Modified Example of the fifth embodiment. FIG. 11 is a diagram corresponding to FIG. 10.

The semiconductor device according to Modified Example of the fifth embodiment is a power semiconductor module 550. The power semiconductor module 550 is different from the power semiconductor module 500 in that the second metal layer 32 also includes the plurality of holes 70.

In the second metal layer 32, a density of a metal layer in the first portion is lower than a density of a metal layer in the second portion, because of the plurality of holes 70 in the first portion. The first portion is disposed between the third region 32b and the second end E2. The second portion is disposed between the fourth region 32c and the second end E2.

As described above, according to the fifth embodiment and Modified Example thereof, similarly to the first to fourth embodiments, by reducing the variation in parasitic inductance of the power semiconductor chips arranged in parallel, it is possible to reduce the switching loss of the power semiconductor module.

In the first to fifth embodiments, the case where the MOSFET is used as the semiconductor chip is described as an example, but the power semiconductor chip is not limited to the MOSFET. For example, other transistors such as IGBTs can be applied as the power semiconductor chips. In addition, as a power semiconductor chip, for example, a MOSFET embedded with no SBD can be applied.

In the first to fifth embodiments, the case where the number of power semiconductor chips arranged in parallel is three is described as an example, but the number of power semiconductor chips may be two or four or more.

In the first to fifth embodiments, the case where the power semiconductor module is a "2-in-1" type module is described as an example, but the power semiconductor module may have another circuit configuration such as a "4-in-1" type or a "6-in-1" type.

In the first to fifth embodiments, the case where the power semiconductor chip is formed by using silicon carbide (SiC) is described as an example, but the power semiconductor chip may be a power semiconductor chip formed by using other semiconductors such as silicon or gallium nitride.

While certain embodiments have been described, these embodiments have been presented by way of example only, and are not intended to limit the scope of the inventions. Indeed, the semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:
1. A semiconductor device comprising:
an insulating substrate having a first end portion and a second end portion opposite to the first end portion;
a first main terminal provided on a first end portion side of the insulating substrate;
a second main terminal provided on the first end portion side of the insulating substrate;

an output terminal provided on a second end portion side of the insulating substrate;

a first metal layer provided on the insulating substrate, the first metal layer having a first region, and the first region being electrically connected to the first main terminal;

a second metal layer provided on the insulating substrate, the second metal layer having a second region, a third region, and a fourth region, and the second region being electrically connected to the second main terminal;

a third metal layer provided on the insulating substrate, the third metal layer disposed between the first metal layer and the second metal layer, the third metal layer having a fifth region, a sixth region, and a seventh region, and the seventh region being electrically connected to the output terminal;

a first semiconductor chip including a first upper electrode, a first lower electrode, and a first gate electrode, the first semiconductor chip being provided on the first metal layer, the first upper electrode being electrically connected to the fifth region, and the first lower electrode being electrically connected to the first metal layer;

a second semiconductor chip including a second upper electrode, a second lower electrode, and a second gate electrode, the second semiconductor chip being provided on the first metal layer, the second upper electrode being electrically connected to the sixth region, the second lower electrode being electrically connected to the first metal layer, and a distance between the first region and the second semiconductor chip being larger than a distance between the first region and the first semiconductor chip;

a third semiconductor chip including a third upper electrode, a third lower electrode, and a third gate electrode, the third semiconductor chip being provided on the third metal layer, the third upper electrode being electrically connected to the third region, and the third lower electrode being electrically connected to the third metal layer; and a fourth semiconductor chip including a fourth upper electrode, a fourth lower electrode, and a fourth gate electrode, the fourth semiconductor chip being provided on the third metal layer, the fourth upper electrode being electrically connected to the fourth region, the fourth lower electrode being electrically connected to the third metal layer, and a distance between the fifth region and the fourth semiconductor chip is larger than a distance between the fifth region and the third semiconductor chip, wherein the second metal layer has a first end on a side facing the third metal layer and a second end on a side opposite to the first end and the second metal layer includes a first slit disposed between the third region and the second end, or wherein the third metal layer has a third end on a side facing the first metal layer and a fourth end on a side opposite to the third end and the third metal layer includes a second slit disposed between the fifth region and the fourth end.

2. The semiconductor device according to claim 1, wherein a first distance between the first end and the first slit is smaller than a second distance between the first slit and the second end.

3. The semiconductor device according to claim 1, wherein a third distance between the third end and the second slit is smaller than a fourth distance between the second slit and the fourth end.

4. The semiconductor device according to claim 1, wherein a length of the first slit in a first direction from the third semiconductor chip toward the fourth semiconductor chip is larger than a length of the third semiconductor chip in the first direction.

5. The semiconductor device according to claim 1, wherein a length of the second slit in a first direction from the third semiconductor chip toward the fourth semiconductor chip is larger than a length of the first semiconductor chip in the first direction.

6. The semiconductor device according to claim 1, wherein the first semiconductor chip includes a first gate resistor, the second semiconductor chip includes a second gate resistor, the third semiconductor chip includes a third gate resistor, and the fourth semiconductor chip includes a fourth gate resistor.

7. The semiconductor device according to claim 6, further comprising:

a first gate terminal electrically connected to the first gate electrode and the second gate electrode, an electrical resistance between the first gate terminal and the first gate electrode and an electrical resistance between the first gate terminal and the second gate electrode being 5Ω or less; and a second gate terminal electrically connected to the third gate electrode and the fourth gate electrode, an electrical resistance between the second gate terminal and the third gate electrode and an electrical resistance between the second gate terminal and the fourth gate electrode being 5Ω or less.

8. The semiconductor device according to claim 1, wherein the first semiconductor chip includes a first Schottky barrier diode, the second semiconductor chip includes a second Schottky barrier diode, the third semiconductor chip includes a third Schottky barrier diode, and the fourth semiconductor chip includes a fourth Schottky barrier diode.

9. The semiconductor device according to claim 1, wherein each of the first semiconductor chip, the second semiconductor chip, the third semiconductor chip, and the fourth semiconductor chip contains silicon carbide.

10. A semiconductor device comprising:

an insulating substrate having a first end portion and a second end portion opposite to the first end portion;

a first main terminal provided on a first end portion side of the insulating substrate;

a second main terminal provided on the first end portion side of the insulating substrate;

an output terminal provided on a second end portion side of the insulating substrate;

a first metal layer provided on the insulating substrate, the first metal layer having a first region, and the first region being electrically connected to the first main terminal;

a second metal layer provided on the insulating substrate, the second metal layer having a second region, a third region, and a fourth region, and the second region being electrically connected to the second main terminal;

a third metal layer provided on the insulating substrate, the third metal layer disposed between the first metal layer and the second metal layer, the third metal layer having a fifth region, a sixth region, and a seventh region, and the seventh region being electrically connected to the output terminal;

a first semiconductor chip including a first upper electrode, a first lower electrode, and a first gate electrode, the first semiconductor chip being provided on the first metal layer, the first upper electrode being electrically connected to the fifth region, and the first lower electrode being electrically connected to the first metal layer;

a second semiconductor chip including a second upper electrode, a second lower electrode, and a second gate electrode, the second semiconductor chip being provided on the first metal layer, the second upper electrode being electrically connected to the sixth region, the second lower electrode being electrically connected to the first metal layer, and a distance between the first region and the second semiconductor chip being larger than a distance between the first region and the first semiconductor chip;

a third semiconductor chip including a third upper electrode, a third lower electrode, and a third gate electrode, the third semiconductor chip being provided on the third metal layer, the third upper electrode being electrically connected to the third region, and the third lower electrode being electrically connected to the third metal layer; and a fourth semiconductor chip including a fourth upper electrode, a fourth lower electrode, and a fourth gate electrode, the fourth semiconductor chip being provided on the third metal layer, the fourth upper electrode being electrically connected to the fourth region, the fourth lower electrode being electrically connected to the third metal layer, and a distance between the fifth region and the fourth semiconductor chip is larger than a distance between the fifth region and the third semiconductor chip, wherein the second metal layer has a first end on a side facing the third metal layer and a second end on a side opposite to the first end, the second metal layer includes a first portion disposed between the third region and the second end and a second portion disposed between the fourth region and the second end, and a density of a metal layer in the first portion is lower than a density of a metal layer in the second portion, or wherein the third metal layer has a third end on a side facing the first metal layer and a fourth end on a side opposite to the third end, the third metal layer includes a third portion disposed between the fifth region and the fourth end and a fourth portion disposed between the sixth region and the fourth end, and a density of a metal layer in the third portion is lower than a density of a metal layer in the fourth portion.

11. The semiconductor device according to claim 10, wherein the first portion includes a plurality of holes.

12. The semiconductor device according to claim 10, wherein the third portion includes a plurality of holes.

13. The semiconductor device according to claim 10, wherein the first semiconductor chip includes a first gate resistor, the second semiconductor chip includes a second gate resistor, the third semiconductor chip includes a third gate resistor, and the fourth semiconductor chip includes a fourth gate resistor.

14. The semiconductor device according to claim 13, further comprising:

a first gate terminal electrically connected to the first gate electrode and the second gate electrode, an electrical resistance between the first gate terminal and the first gate electrode and an electrical resistance between the first gate terminal and the second gate electrode being 5Ω or less; and a second gate terminal electrically connected to the third gate electrode and the fourth gate electrode, an electrical resistance between the second gate terminal and the third gate electrode and an electrical resistance between the second gate terminal and the fourth gate electrode being 5Ω or less.

15. The semiconductor device according to claim 10, wherein the first semiconductor chip includes a first Schottky barrier diode, the second semiconductor chip includes a second Schottky barrier diode, the third semiconductor chip includes a third Schottky barrier diode, and the fourth semiconductor chip includes a fourth Schottky barrier diode.

16. The semiconductor device according to claim 10, wherein each of the first semiconductor chip, the second semiconductor chip, the third semiconductor chip, and the fourth semiconductor chip contains silicon carbide.

* * * * *